US006636012B2

(12) United States Patent
Royak et al.

(10) Patent No.: US 6,636,012 B2
(45) Date of Patent: Oct. 21, 2003

(54) STATOR AND ROTOR RESISTANCE IDENTIFIER USING HIGH FREQUENCY INJECTION

(75) Inventors: Semyon Royak, Beachwood, OH (US); Mark M. Harbaugh, Richfield, OH (US); Russel J. Kerkman, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/967,112

(22) Filed: Sep. 28, 2001

(65) Prior Publication Data

US 2003/0062870 A1 Apr. 3, 2003

(51) Int. Cl.$^7$ ................................................. H02P 7/36
(52) U.S. Cl. ........................ 318/727; 318/490; 318/727; 318/728; 318/729; 318/807; 318/808; 318/809; 318/810; 318/811; 318/823; 318/824; 318/825
(58) Field of Search ................................. 318/727, 809, 318/490, 810, 811, 728–729, 807, 808, 823–825

(56) References Cited

U.S. PATENT DOCUMENTS 5,796,236 A * 8/1998 Royak ........................ 318/804
6,281,659 B1 * 8/2001 Giuseppe .................... 318/799

* cited by examiner

Primary Examiner—Robert E. Nappi
Assistant Examiner—Renata McCloud
(74) Attorney, Agent, or Firm—Quarles & Brady, LLC; Alex Gerasimow; William R. Walbrun

(57) ABSTRACT

A method and apparatus for generating stator and rotor resistance estimate, the method including the steps of providing high frequency injection voltage signals to a three phase motor, rotating three phase feedback current therefrom, converting the feedback currents to two phase currents that represent the high frequency component of the current vector wherein the d and q axis components are within a two phase voltage coordinate system and driving a regulator via one of the current components to generate a lag angle estimate, the lag angle estimate used to solve any of several different equations to calculate the stator and rotor resistance estimates.

28 Claims, 7 Drawing Sheets

Fig. 7
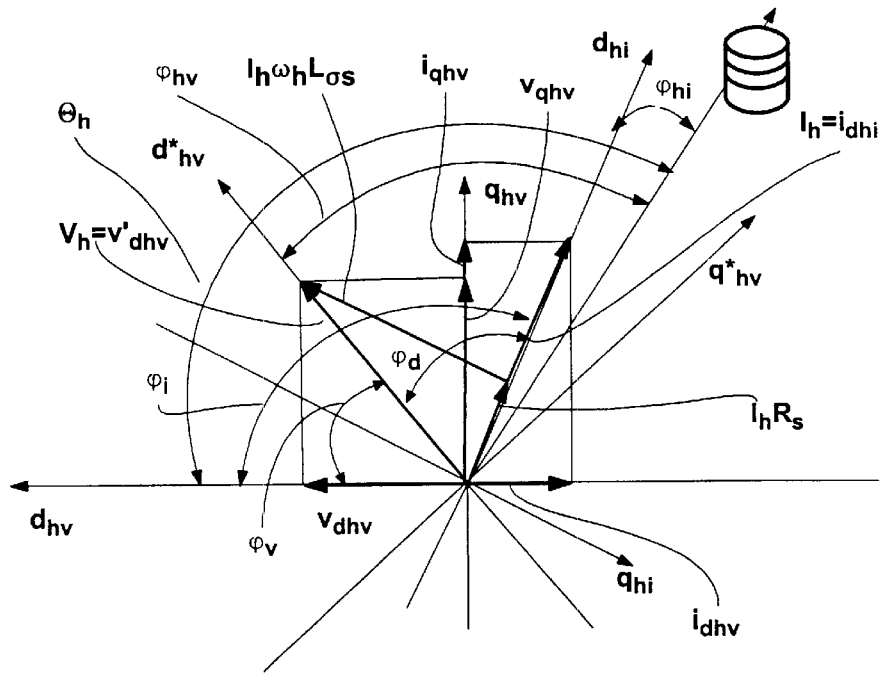
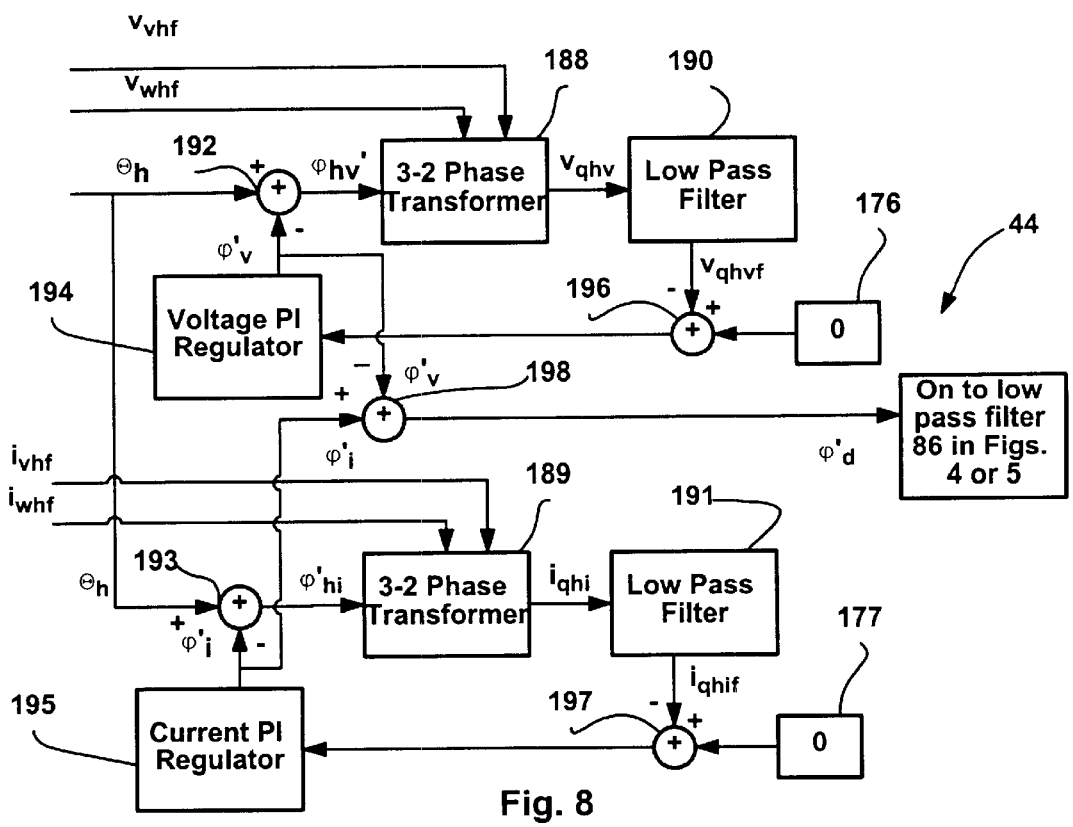
Fig. 8

STATOR AND ROTOR RESISTANCE IDENTIFIER USING HIGH FREQUENCY INJECTION

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The field of the invention is AC induction motor drives and more specifically the area of injecting high frequency voltage signals into an AC induction motor and using high frequency feedback signals to identify dynamic motor operating parameters.

Induction motors have broad application in industry, particularly when large horsepower is needed. In a three-phase induction motor, three phase alternating voltages are impressed across three separate motor stator windings and cause three phase currents therein. Because of inductances, the three currents typically lag the voltages by some phase angle. The three currents produce a rotating magnetic stator field. A rotor contained within the stator field experiences an induced current (hence the term "induction") which generates a rotor field. The rotor field typically lags the stator field by some phase angle. The rotor field is attracted to the rotating stator field and the interaction between the two fields causes the rotor to rotate.

A common rotor design includes a "squirrel cage winding" in which axial conductive bars are connected at either end by shorting rings to form a generally cylindrical structure. The flux of the stator field cutting across the conductive bars induces cyclic current flows through the bars and across the shorting rings. The cyclic current flows in turn produce the rotor field. The use of this induced current to generate the rotor field eliminates the need for slip rings or brushes to provide power to the rotor, making the design relatively maintenance free.

To a first approximation, the torque and speed of an induction motor may be controlled by changing the frequency of the driving voltage and thus the angular rate of the rotating stator field. Generally, for a given torque, increasing the stator field rate will increase the speed of the rotor (which follows the stator field). Alternatively, for a given rotor speed, increasing the frequency of the stator field will increase the torque by increasing the slip, that is the difference in speed between the rotor and the stator fields. An increase in slip increases the rate at which flux lines are cut by the rotor, increasing the rotor generated field and thus the force or torque between the rotor and stator fields.

Referring to FIG. 1, a rotating phasor 1 corresponding to a stator magneto motive force ("mmf") will generally have some angle α with respect to the phasor of rotor flux 2. The torque generated by the motor will be proportional to the magnitudes of these phasors 1 and 2 but also will be a function of their angle α. Maximum torque is produced when phasors 1 and 2 are at right angles to each other whereas zero torque is produced if the phasors are aligned. The stator mmf phasor 1 may therefore be usefully decomposed into a torque producing component 3 perpendicular to rotor flux phasor 2 and a flux component 4 parallel to rotor flux phasor 2.

These two components 3 and 4 of the stator mmf are proportional, respectively, to two stator current components: iq, a torque producing current, and id, a flux producing current, which may be represented by orthogonal vectors in the rotating frame of reference (synchronous frame of reference) of the stator flux having slowly varying magnitudes.

Accordingly, in controlling an induction motor, it is generally desired to control not only the frequency of the applied voltage (hence the speed of the rotation of the stator flux phasor 1), but also the phase of the applied voltage relative to the current flow and hence the division of the currents through the stator windings into the iq and id components. Control strategies that attempt to independently control currents iq and id are generally termed field oriented control strategies ("FOC").

Generally, it is desirable to design FOCs that are capable of driving motors of many different designs and varying sizes. Such versatility cuts down on research, development, and manufacturing costs and also results in easily serviceable controllers.

Unfortunately, while versatile controllers are cost-effective, FOC controllers cannot control motor operation precisely unless they can adjust the division of d and q-axis currents through the stator windings to account for motor-specific operating parameters. For this reason, in order to increase motor operating precision, various feedback loops are typically employed to monitor stator winding currents and voltages and/or motor speed. A controller uses feedback information to determine how the inverter supplied voltage must be altered to compensate for system disturbances due to system specific and often dynamic operating parameters and then adjusts control signals to supply the desired inverter voltages.

To this end, in an exemplary FOC system two phase d and q-axis command currents are provided that are calculated to control a motor in a desired fashion. The command currents are compared to d and q-axis motor feedback currents to generate error signals (i.e., the differences between the command and feedback currents). The error signals are then used to generate d and q-axis command voltage signals which are in turn transformed into three phase command voltage signals, one voltage signal for each of the three motor phases. The command voltage signals are used to drive a pulse width modulated (PWM) inverter that generates voltages on three motor supply lines. To provide the d and q-axis current feedback signals the system typically includes current sensors to sense the three phase line currents and a coordinate transformation block is used to transform the three phase currents to two phase dq frame of reference feedback currents.

In addition to requiring two phase signals and three phase signals to perform 2-to-3 and 3-to-2 phase transformations, respectively, a flux position angle is also required. One common way to generate a flux angle feedback estimate is to integrate a stator frequency. A stator frequency can be determined by adding a measured rotor frequency (rotor speed) and calculated slip frequency. Slip frequency calculations require motor parameter values such as a rotor resistance, leakage inductance, etc. Therefore, precise parameter values are necessary to eliminate errors in flux angle determinations.

In the case of drives that do not include a speed sensor it is necessary to estimate both the rotor frequency and the slip frequency to determine the flux angle. Thus, these drives also require precise knowledge of motor parameter values.

Usually, drives that do not includes speed sensors cannot operate at low rotor frequencies (e.g., below 3 Hz) due to motor parameter estimation errors.

Recently, a method for flux angle feedback determination was developed to overcome the low speed operating problems in drives that do not include speed sensors. This method includes injecting a known high frequency voltage signal into each of the command voltage signals used to drive the PWM inverter and use feedback current (or voltage) signals to determine the flux angle. To this end, an exemplary system converts a high frequency command signal into a high frequency phase angle and then generates a first injection signal that is the product of a scalar and the sine of the high frequency phase angle. Second and third injection signals are also generated, each of the second and third signals phase shifted from the first signal by 120 degrees. A separate one of the first, second and third signals is then added to a separate one of the three voltage command signals.

Algorithms to generate a flux position angle estimate as a function of a negative sequence high frequency current components or zero sequence high frequency current (or voltage) components are well known in the controls art and therefore will not be explained here in detail.

The high frequency voltage injection methods can be used to identify a flux angle position without using motor parameters. The derivative of the flux angle position can be used as an estimated stator frequency. Therefore, an estimated rotor speed can be determined by subtracting slip frequency from estimated stator frequency. As well known, slip frequency is a function of motor parameters. Thus, to accurately estimate speed it is still necessary to precisely identify motor parameters such as rotor resistor, etc. In many cases nameplate resistances and inductances are provided for specific motors and those values can be used in system algorithms to generate the estimates.

Unfortunately, several of the parameters that are used in the speed estimation algorithms change as a function of motor operation and therefore the algorithms are not always accurate and, in fact, the accuracy of the algorithms changes during motor operation. For instance, stator resistance changes with temperature and stator winding temperature increases as the average current through a winding increases. Thus, in a variable speed motor, when inverter supplied voltage and current is increased or decreased, the stator resistance is subject to change which in turn results in an unexpected demand in stator voltage. Similar comments are applicable to rotor resistance.

Recognizing these problems the industry has devised various methods of determining stator and rotor resistances during motor operation. Unfortunately, each of the prior methods have been either extremely computationally intensive, relatively inaccurate or relatively expensive to implement (e.g., requiring a plurality of sensors, etc.). Therefore, it would be advantageous to have a relatively inexpensive and simple method and apparatus that could generate accurate stator and rotor resistance estimates for use in induction motor control with or without speed sensor.

BRIEF SUMMARY OF THE INVENTION

The angle between a high frequency injection voltage and a resulting high frequency current can be used to determine an instantaneous stator resistance value. The stator resistance value along with some commissioning values can in turn be used to determine a rotor resistance value. Thus, if the voltage-current lag angle between high frequency voltage and current can be determined dynamically and routinely, the rotor and stator resistances can be determined.

It has been recognized that using a voltage-current lag angle estimate, three phase injected voltages can be mapped to a dq high frequency voltage reference frame wherein the high frequency voltage has to be aligned with a d axis and three phase feedback currents can be mapped to a new established current dq reference frame wherein the high frequency current is aligned with one of the d or q axis when the estimate is accurate. Inaccuracy in the estimate shows up as a vector component orthogonal to the vector with which the high frequency current should be aligned. Therefore, by adjusting the voltage-current lag angle estimate as a function of the orthogonal vector component, the voltage-current lag angle estimate error can be eliminated. Specifically, by driving the orthogonal vector component to zero, an accurate angle estimate can be rendered. Thereafter the angle estimate can be used to determine instantaneous stator and rotor resistance estimates.

An exemplary embodiment of the invention includes a method for estimating a motor stator resistance in a three phase motor characterized by a stator leakage inductance and driven by a pulse width modulator that is linked to the motor via three supply lines, the method for use with a system that receives a high frequency voltage command signal and causes high frequency voltages to be injected into each of the three motor phases at the high frequency. Let's assume for simplicity that the high frequency voltage is injected along the d-axis. Here, the method comprises the steps of identifying a high frequency command angle, subtracting a current lag angle estimate from the high frequency command angle to generate a high frequency current angle, obtaining feedback currents from the supply lines, converting the feedback currents into two orthogonal phase currents using the high frequency current angle, providing a closed loop system for a first of the two orthogonal phase currents to drive the first of the two orthogonal phase currents to zero by using a PI controller, using the output of this PI controller as a current lag angle estimate and using the current lag angle estimate as a voltage-current lag angle estimate to generate the stator resistance estimate.

The step of using the voltage-current lag angle estimate may include the step of mathematically combining the angle estimate, the stator leakage inductance and the high frequency command signal to generate the stator resistance estimate. The step of mathematically combining in some embodiments includes the step of determining the cotangent of the voltage-current lag angle estimate to generate a cotangent value, converting the high frequency command signal into a radians per second value and multiplying the radians per second value, the cotangent value and the stator leakage reactance to generate the stator resistance estimate.

The invention is also for generating a rotor resistance estimate and, to that end, may include the step of using the voltage-current lag angle estimate to generate the rotor resistance estimate. In this case, the step of using the voltage-current lag angle estimate to generate the rotor resistance estimate in some embodiments includes the step of identifying and storing an initial voltage-current lag angle estimate, identifying an initial rotor resistance estimate, dividing the initial voltage-current lag angle estimate by the voltage-current lag angle estimate to generate a stator resistance ratio and multiplying the initial rotor resistance estimate by the stator resistance ratio to generate the rotor resistance estimate.

The step of mathematically combining may include the steps of determining the tangent of ninety degrees less the voltage-current lag angle estimate to generate a tangent value, multiplying the high frequency command signal in radians per second, the tangent value and the stator leakage reactance to generate the stator resistance estimate.

The step of identifying a voltage lag angle estimate where the voltage initially does not align with the d axis may include the steps of converting the high frequency signal into a high frequency command angle, subtracting a voltage lag angle estimate from the high frequency command angle to generate a high frequency voltage angle, obtaining feedback voltages from the supply lines, converting the feedback voltages into two orthogonal phase voltages using the high frequency voltage angle, providing a closed loop system for a first of the two orthogonal phase voltages to drive the first of the two orthogonal phase voltages to zero by using of a PI controller, using the output of this PI controller as a voltage lag angle estimate and then use this voltage lag angle estimate for the voltage-current lag angle estimate calculation by subtracting the voltage lag angle estimate from the current lag angle estimate.

The invention also includes apparatus for performing each of the methods described above.

Thus, it should be appreciated that relatively inexpensive and simple systems and methods have been described for determining the phase lag angle between high frequency voltage and current signals which can be performed essentially continuously during motor operation or on a periodic basis, the lag estimate then useable to determine rotor and stator resistances to facilitate more accurate motor control.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

BRIEF DESCRIPTION OF THE SEVERAL VIEWS OF THE DRAWINGS

FIG. 7 is a graph similar to FIG. 6 where high frequency voltage has been injected between the d and q axis;

FIG. 8 is similar to FIG. 4 albeit including additional components for use where high frequency voltage is injected between d and q axis as in FIG. 7;

DETAILED DESCRIPTION OF THE INVENTION

In the description that follows, an "*" superscript denotes a command signal, an "f" subscript denotes a feedback signal, an "h" subscript denotes a high frequency signal, an "i" subscript denotes that a corresponding signal relates to a current signal, a "v" subscript denotes that a signal relates to a voltage signal, an "r" subscript denotes a signal related to a motor rotor, an "s" subscript denotes a signal relates to a motor stator, a "d" subscript denotes that a signal corresponds to a d-axis, a "q" subscript denotes that a signal corresponds to a q-axis, and "u", "v" and "w" subscripts denote that corresponding signals relate to each of first, second and third system phases.

While the following description details various blocks, steps, and functions, it should be remembered that all of these elements are meant to be implemented in software as computer programs and represent algorithms for execution by a conventional-type digital processor adapted for industrial applications, such as a model 8096 microelectronic processor as supplied by Intel Corporation of Santa Clara, Calif.

A. Theory

Figure 3:
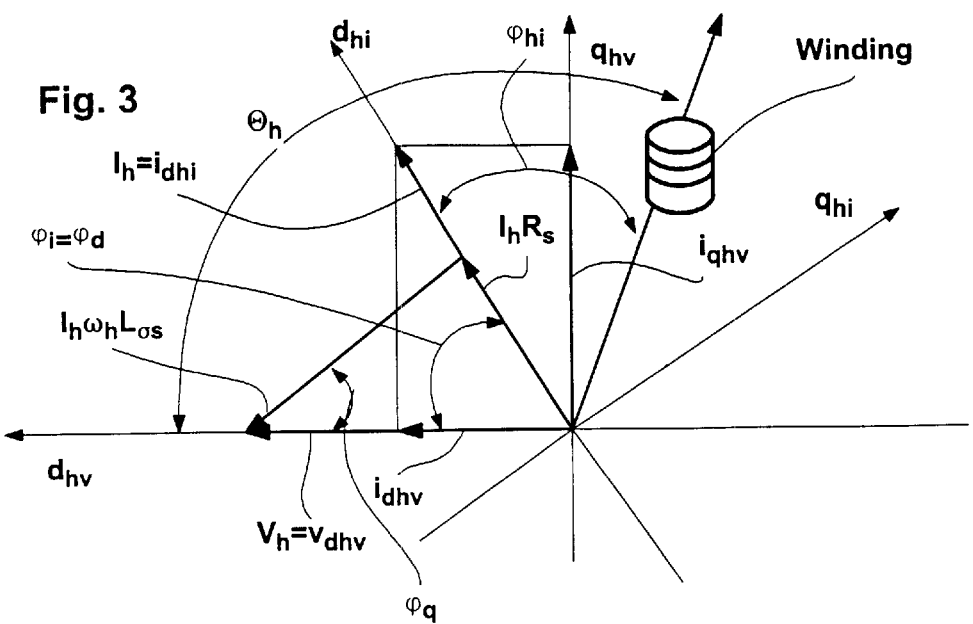
FIG. 3 is a graph showing two dq reference frames and a number of important electrical characteristics of an operating induction motor.

When an "injected" high frequency voltage signal $V_h$ is provided across motor stator windings that rotates at a changing command angle $\theta_h$ (i.e., a rotating angle is equal to an integral of injected high frequency $\omega_h$, where $\omega_h$ is the value of the injected high frequency in radians/second), the high frequency voltage $V_h$ generates a high frequency current $I_h$ in the windings. Referring to FIG. 3, because every motor stator is characterized by some stator leakage inductance $L_{\sigma s}$, the resulting high frequency current $I_h$ lags the voltage $V_h$ by a lag angle $\phi_d$ and the trigonometric relationship between the high frequency voltage $V_h$ and current $I_h$ as illustrated results.

At a very basic level, it should be appreciated that, referring to FIG. 3, assuming a constant injected voltage $V_h$, as stator resistance $R_s$ changes, angle $\phi_d$ also changes. Specifically, as resistance $R_s$ increases, lag angle $\phi_d$ decreases and vice versa. More specifically, applying well known trigonometric equations and relationships to the phasors of FIG. 3, stator resistance $R_s$ can be calculated by solving the following equation:

$$R_s = ctg(\phi_d)(\omega_h)(L_{\sigma s}) \qquad \text{Eq. 1}$$

The injected frequency $\omega_h$ is controlled and known and leakage inductance $L_{\sigma s}$ is constant for any given motor and supply system and independent from motor temperature. Thus, an accurate estimate of lag angle $\phi_d$ can be calculated, an instantaneous stator resistance estimate $R_s$ can be generated for use in various control algorithms.

As well known in the FOC industry, any rotating vector can be represented by two separate orthogonal vectors in a dq frame of reference. For instance, referring again to FIG. 3, voltage $V_h$ can be resolved into voltage vectors $V_{dhv}$ and $V_{qhv}$ in a $d_{hv}$, $q_{hv}$ frame of reference. In FIG. 3 high frequency voltage $V_h$ only includes a d-axis component $V_{dhv}$ and therefore $V_{qhv}$ is not illustrated. This frame of reference with $d_{hv}$, $q_{hv}$ axis is referred to as a voltage reference frame.

Referring still to FIG. 3, high frequency current $I_h$ may also be resolved into two vectors within a dq frame of reference. For instance, as illustrated, in voltage reference frame $d_{hv}q_{hv}$, current $I_h$ includes orthogonal vectors $i_{dhv}$ and $i_{qhv}$.

In FIG. 3 a second dq reference frame $d_{hi}q_{hi}$ is illustrated. Second reference frame $d_{hi}q_{hi}$ includes a d-axis $d_{hi}$ that coincides with high frequency current $I_h$ and hence is referred to hereinafter as a current reference frame. Because the current $I_h$ coincides with the d-axis of the current reference frame, in the current reference frame there is no q-axis current component. It should be appreciated from FIG. 3 that current reference frame $d_{hi}q_{hi}$ is phase shifted and lags behind voltage reference frame $d_{hv}q_{hv}$ by the current lag angle $\phi_i$ that is equal to the voltage-current lag angle $\phi_d$ in this example, the angle between high frequency voltage $V_h$ and current $I_h$.

Determining d and q-axis feedback current vectors within specific frames of reference is as simple as converting three phase currents to two orthogonal phase currents using a phase angle corresponding to the shift between a reference point (e.g., an axis of one of the phases of the stator windings) and the axis of the specific reference frame. For example, referring again to FIG. 3 and also to FIG. 2, where angle $\theta_h$ is a high frequency command angle, feedback currents corresponding to high frequency current $I_h$ can be divided into $i_{dhv}$ and $i_{qhv}$ vectors by converting three to two orthogonal phase feedback currents using angle $\theta_h$. Similarly, current $I_h$ can be divided into vectors $i_{dhi}$ and $i_{qhi}$ in the current frame of reference by converting using a high frequency current angle $\phi_{hi}$.

Angle $\phi_{hi}$ is equal to high frequency command angle $\theta_h$ minus current lag angle $\phi_i$. Therefore, by converting feedback currents to two orthogonal phase vectors using angle $\phi_{hi}=\theta_h-\phi_i$, current vectors $i_{dhi}$ and $i_{qhi}$ can be determined.

As indicated above, if in current reference frame $d_{hi}q_{hi}$ the q-axis current vector is equal to zero and high frequency current $I_h$ coincides with the $d_{hi}$ axis then the current lag angle $\phi_i$ between the voltage reference frame and the current reference frame (between axis $d_{hv}$ axis $d_{hi}$) is equal to a voltage-current lag angle $\phi_d$. Thus, any q-axis current $i_{qhi}$ is indicative of an error in the high frequency current angle estimate (i.e., $\theta_h-\phi_i$). Hereinafter, any estimated value will be identified by a "'" after the signal. Because angle $\theta_h$ is a high frequency command angle, any error in estimate $\theta_h-\phi_i'$ must be attributed to angle $\phi'_i$. In summary, when current $I_h$ is divided into d and q-axis vectors in the current reference frame using a current lag angle estimate $\phi'_i$, any q-axis vector $i_{qhi}$ is indicative of an estimate $\phi'_i$ error. Thus, adjusting phase angle estimate $\phi'_i$ as a function of q-axis vectors $i_{qhi}$, estimate $\phi'_i$ can be driven to its correct value.

According to the present invention, a current lag angle estimate $\phi'_i$ (that is equal to angle $\phi'_d$ in this example) is subtracted from the high frequency command angle $\theta_h$ to generate a high frequency current angle estimate $\phi'_{hi}$. Feedback currents from three phase voltage supply lines are obtained. The high frequency current angle estimate $\phi'_{hi}$ is then used to convert the feedback signals from three to two orthogonal phase currents.

Three-to-2 phase conversion and 2-to-3 phase conversion are well known in the controls art and therefore will not be explained here in detail. Suffice it to say that 3-to-2 phase conversion simply receive three phase signals and a conversion angle and converts the three phase signals to two phase signals on orthogonal axis where the two phase signals together define a single phasor. Two-to-3 phase conversion performs a reverse function.

After the 3-to-2 phase conversion, the resulting orthogonal current vectors are in the current reference frame including d and q-axis components $i_{dhi}$ and $i_{qhi}$ as illustrated in FIG. 3. Next, the q-axis current vector $i_{qhi}$ is negated and stepped up by a proportional-integral (PI) regulator to generate the current lag angle estimate $\phi'_i$ that is equal to the voltage-current lag angle estimate $\phi'_d$ in this example. Estimate $\phi'_i=\phi'_d$ is again subtracted from the command angle $\theta_h$ to form a closed control loop. In addition, estimate $\phi'_d$ is also plugged into Equation 1 above for angle $\phi_d$ to generate resistance estimate $R'_s$.

The rotor resistance $R_r$ changes proportionally to the change in voltage-current lag angle estimate $\phi'_d$. Thus, if an initial rotor resistance $R_{ro}$ is determined and stored and an initial voltage-current lag angle estimate $\phi'_{do}$ corresponding to the initial resistance estimate $R_{ro}$ is determined and stored, those values, together with the instantaneous voltage-current lag angle estimate $\phi'_d$, can be used to estimate the instantaneous rotor resistance $R'_r$. To this end, instantaneous estimate $R'_r$ can be calculated by solving the following equation:

$$R'_r=(R_{ro})(\phi'_{do}/\phi'_d) \qquad \text{Eq. 2}$$

Referring again to FIG. 3, other trigonometric relationships can be used to formulate other equations useable to determine resistance $R'_s$. For instance, instead of using Equation 1 above, the following equation may be used to calculate resistance $R'_s$:

$$R'_s=\tan(90°-\phi'_d)(\omega_h)(L_{ls}) \qquad \text{Eq. 3}$$

In this case the invention works in a fashion similar to that described above to generate estimate $\phi'_d$ which is then used to solve Equation 3. In addition, in this case, when calculating rotor resistance $R'_r$, the following equation replaces Equation 2:

$$R'_r=(R_{ro})\tan(90°-\phi'_{do})/\tan(90°-\phi'_d) \qquad \text{Eq. 4}$$

B. Implementation

Referring now to the drawings wherein like reference characters represent similar elements and signals throughout the several views and, more specifically, a referring to FIG. 2, the present invention will be described in the context of an exemplary motor control system 10 including a plurality of summers 12, 14, 20, 22 and 24, a plurality of multipliers 34, 36 and 38, a current regulator 16, a 2-3 phase transformer 18, a PWM inverter 26, a three phase motor 28, an integrator 30, a sign table 32, an A-D converter-scalar 40, a 3-2 phase transformer 42, a stator-rotor resistance identifier 44, a flux angle position-speed determiner 46, and three filters 48, 50 and 52.

Generally, system 10 receives two phase current command signals $i_q^*$ and $i_d^*$ and, based thereon, generates three phase voltages on motor supply lines linked to motor 28 to drive motor 28 in a desired fashion. The three phase voltages $V^*_u$, $V^*_v$, and $V^*_w$ together generate currents within each of the three motor phases. The three phase currents are sensed using hall effect sensors or some other suitable sensors (not illustrated) and are provided as feedback currents to a plurality of feedback loops that are provided to eliminate the difference between the command currents $i_q^*$ and $i_d^*$ and the resulting currents delivered to the motor 28.

Command currents $i_q^*$ and $i_d^*$ are provided to summers 14 and 12, respectively. The three phase motor currents are converted in a manner which will be described in more detail below to two phase d and q access feedback currents $i_{df}$ and $i_{qf}$, respectively, the two phase feedback currents $i_{df}$ and $i_{qf}$ being provided to summers 12 and 14, respectively. Summer 12 subtracts the d-axis feedback current $i_{df}$ from the d-axis command current $i_d^*$ to generate a d-axis error signal, which is provided to regulator 16. Similarly, summer 14 subtracts the q-axis feedback current $i_{qf}$ from the q-axis command current $i_q^*$ to generate an error signal, which is provided to regulator 16. Regulator 16 converts the current error signals to command voltage signals $V_q^*$ and $V_d^*$, which are provided to 2-3 phase transformer 18.

Transformer 18 receives an electrical phase angle $\theta_e$ from determiner 46 and, using the received angle, coverts the command voltages $V_q^*$ and $V_d^*$ to three phase command voltages $V^*_u$, $V^*_v$ and $V^*_w$. The three phase command voltages are provided to summers 20, 22 and 24, respectively. Each of summers 20, 22 and 24 also receives a high frequency injection voltage signal. Generation of the high frequency injection voltage signals is described in more detail below. Summer 20 adds the received signals (i.e., command signal $V^*_u$ and the high frequency injection voltage signal) and generates a modified single-phase voltage signal $V_{um}$, which is provided to inverter 26. Similarly, each of summers 22 and 24 adds their respective received signals and provides an output modified voltage signal $V_{vm}$ and $V_{wm}$, respectively, to inverter 26. Inverter 26 uses the modified voltage signals $V_{um}$, $V_{vm}$ and $V_{wm}$ to generate the three phase voltages $V_v$, $V_u$ and $V_w$ on the motor supply lines.

Figure 1:
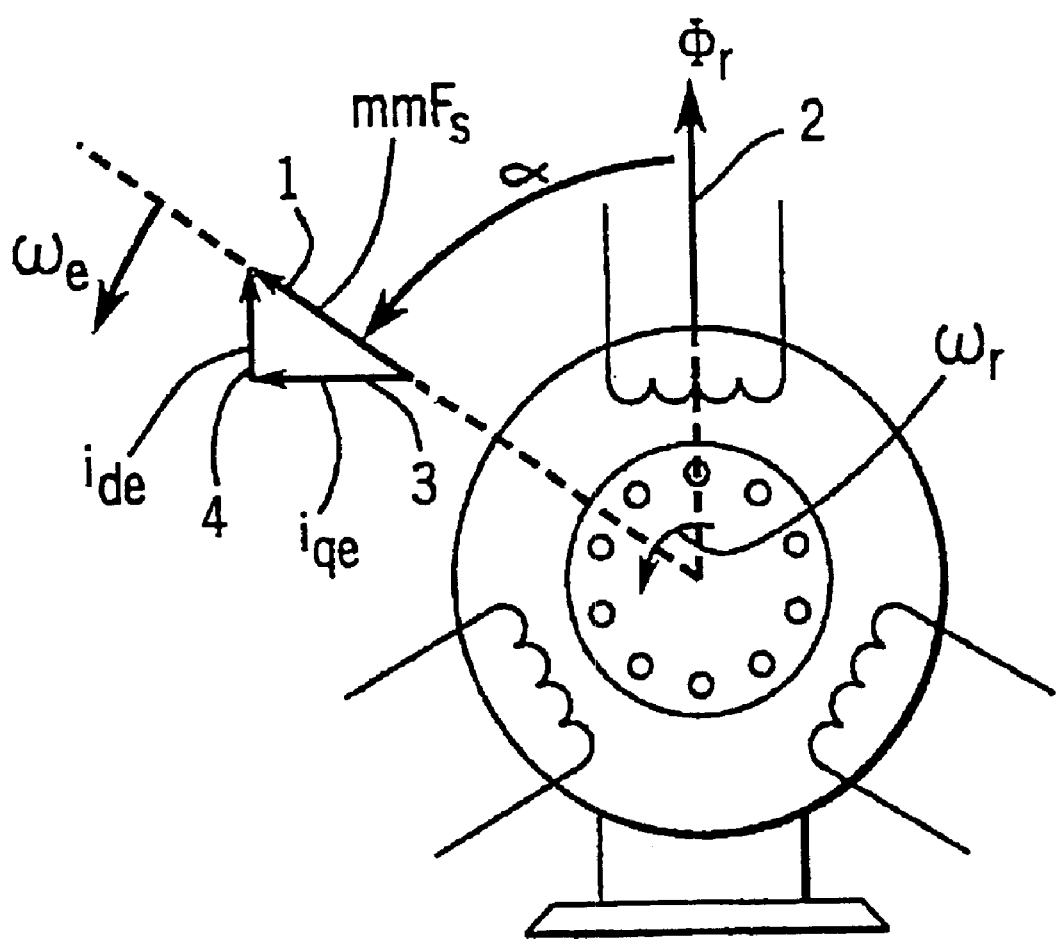
FIG. 1 is a schematic view in cross section of an induction motor showing instantaneous locations of a rotor flux, a stator mmf and the torque and flux components of the stator mmf.
Figure 2:
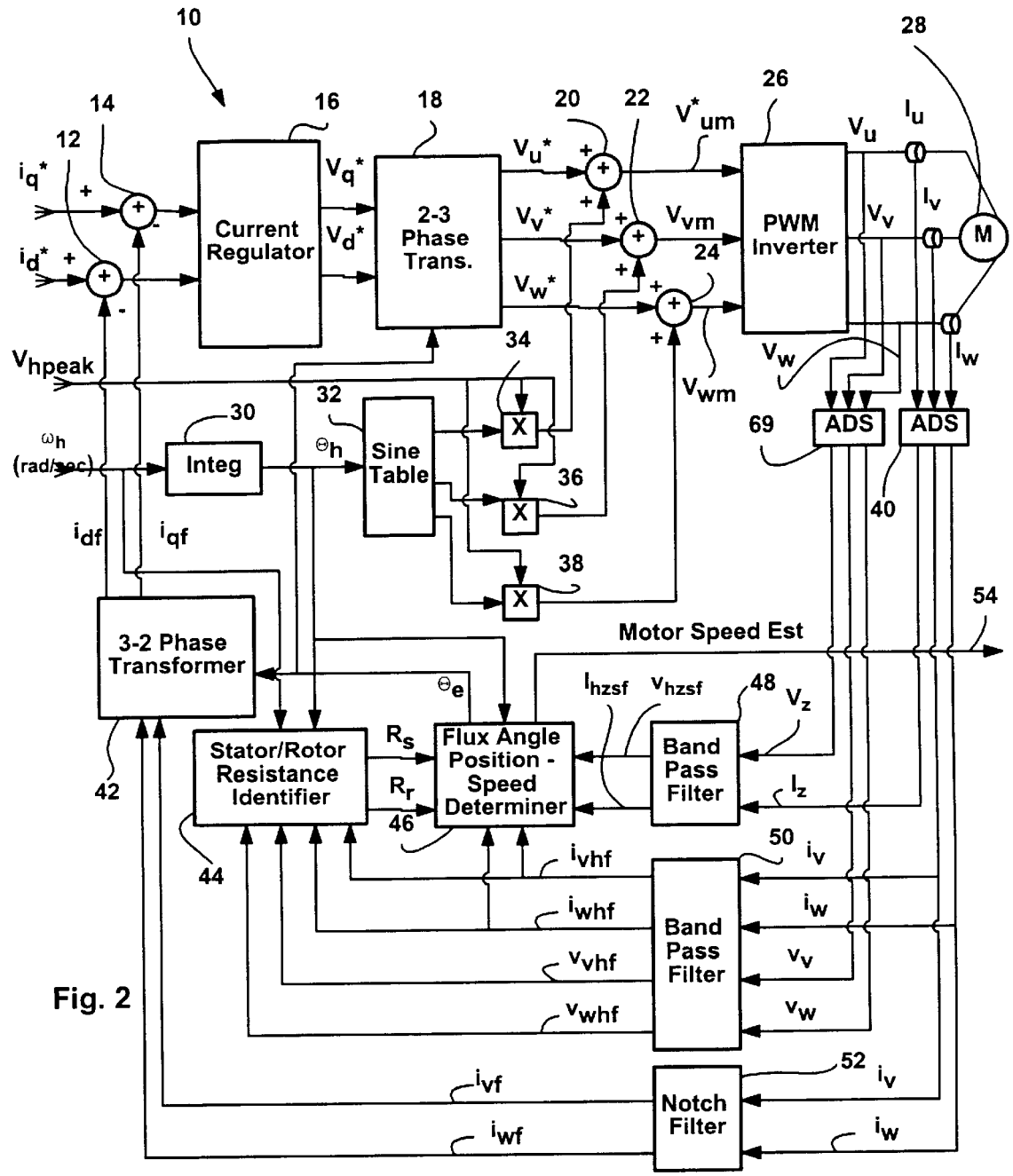
FIG. 2 is a schematic diagram of a motor control system according to the present invention.

Referring still to FIG. 2, in addition to command currents $i^*_q$ and $i^*_d$, two other values are provided as inputs to system 10 and are specifically used to generate the high frequency injection voltage signals that are added to the three phase command voltages $V^*_u$, $V^*_v$ and $V^*_w$ via summers, 20, 22 and 24. Specifically, a peak high frequency magnitude signal $V_{hpeak}$ and a high frequency signal $\omega_n$ are provided. High frequency signal $\omega_h$ is provided to stator-rotor resistance identifier 44 and to integrator 30, which integrates the received signal and provides a high frequency angle signal $\theta_h$ to sine table 32. Sine table 32 has first, second and third outputs which are linked to multipliers 34, 36 and 38, respectively. On the first output (i.e., the output linked to multiplier 34), sine table 32 provides the sine of high frequency angle $\theta_h$. On the second output (i.e., the output linked to multiplier 36), sine table 32 provides the sine of $(\theta_h+2\pi/3)$. On the third output (i.e., the output linked to multiplier 38), sine table 32 provides the sine of $(\theta_h+4\pi/3)$. Thus, sine table 32 generates three outputs where the outputs are the sines of angles that are separated by 120°.

The peak high frequency amplitude signal $V_{hpeak}$ is also provided to each of multipliers 34, 36 and 38. Multiplier 34 multiplies its received signals to generate the high frequency injection voltage signal provided to summer 20. Similarly, each of multipliers 36 and 38 multiplies their respective received signals together to generate high frequency injection signals that are provided to summers 22 and 24, respectively. As indicated above, summers 20, 22 and 24 add the high frequency signals to the three phase command signals $V_v$, $V_u$ and $V_w$ to generate the modified voltages $V_{um}$, $V_{vm}$ and $V_{wm}$ to drive inverter 26.

The feedback currents from the three motor phases are provided to the analog to digital converter and scalar 40 which converts the received signals to digital signals and steps up the signals where appropriate by a scalar number. Module 40 provides output to band pass filter 48 which outputs a zero sequence high frequency current $i_{hzsf}$ which is provided to flux position determiner 46. Zero sequence signals and their use by determiners like determiner 46 are well know in the FOC industry and therefore will not be described here in detail.

Converter 40 also provides two of the three phase current feedback signals $i_v$ and $i_w$ to each of band pass filter 50 and notch filter 52. Band pass filter 50 passes only the high frequency components of the feedback currents $i_v$ and $i_w$ thereby providing high frequency currents $i_{vhf}$ and $i_{whf}$ to stator-rotor resistance identifier 44 and optionally to determiner 46. Again, determiner 46 algorithms using currents $i_{vhf}$ and $i_{whf}$ are known and therefore not explained herein detail. Notch filter 52 provides currents $i_{vf}$ and $i_{wf}$ including components only within a specific notch range. More specifically, the notch range will typically be restricted to a range around the high frequency $\omega_h$ provided to integrator 30. In this manner, the injected high frequency currents should be filtered out and should not directly effect the comparison of command and feedback currents by summers 12 and 14.

The three phase currents output by notch filter 52 are provided to the three to two phase transformer 42. As well known in the controls art, the third of the three phase currents (i.e., $i_{uf}$) can be determined using currents $i_{vf}$ and $i_{wf}$. Therefore, transformer 42 first determines the third of the three phase feedback currents $i_{uf}$ and then uses all of the three phase feedback currents and the electrical angle $\Theta_e$ provided by position-speed determiner 46 to generate the d and q-axis feedback currents $i_{df}$ and $i_{qf}$, respectively. As described above, the d and q-axis feed back currents $i_{df}$ and $i_{qf}$, respectively, are provided to summers 12 and 14 and are subtracted from corresponding command current signals $i_q^*$ and $i_d^*$.

Figure 4:
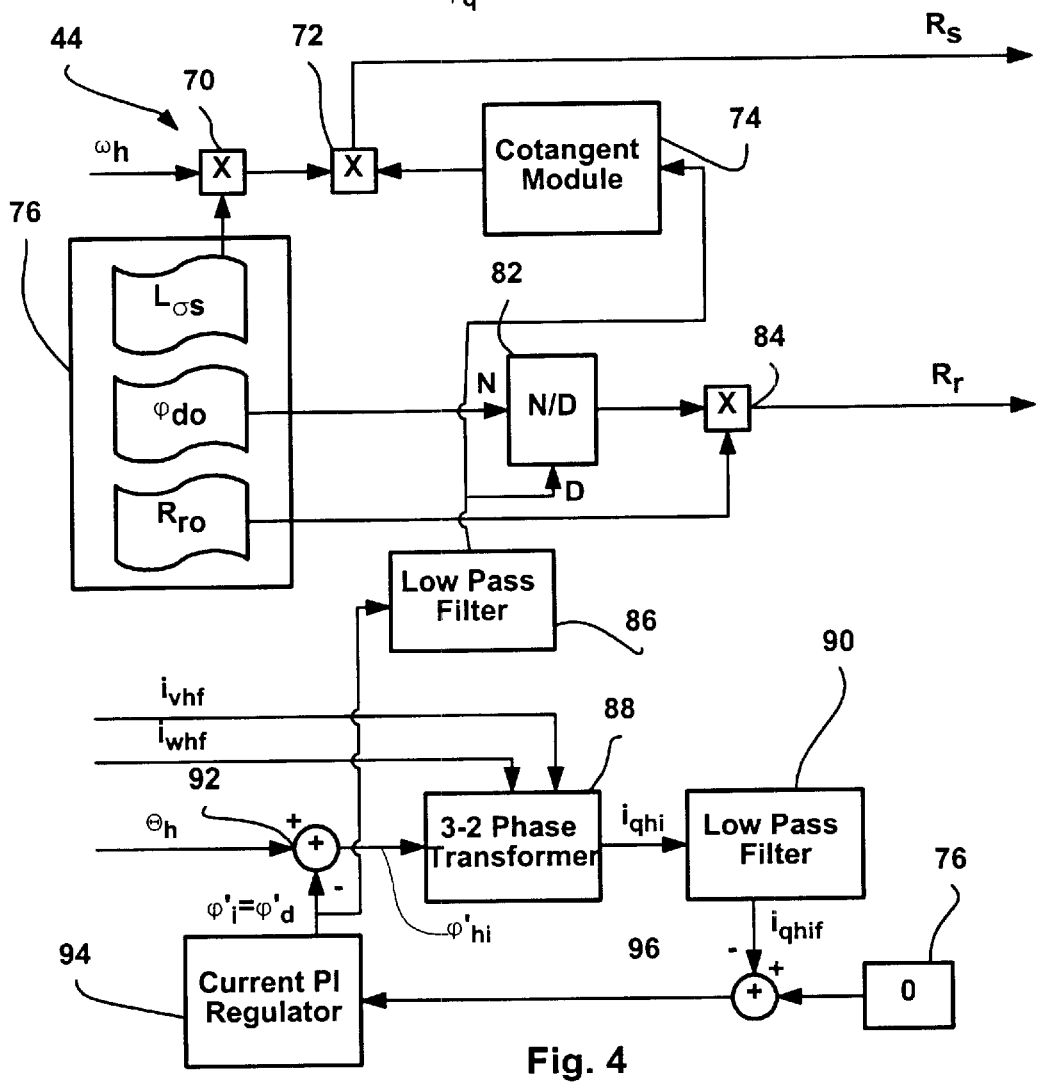
FIG. 4 is a schematic illustrating one embodiment of the stator/rotor resistance identifier of FIG. 2.
Figure 10:
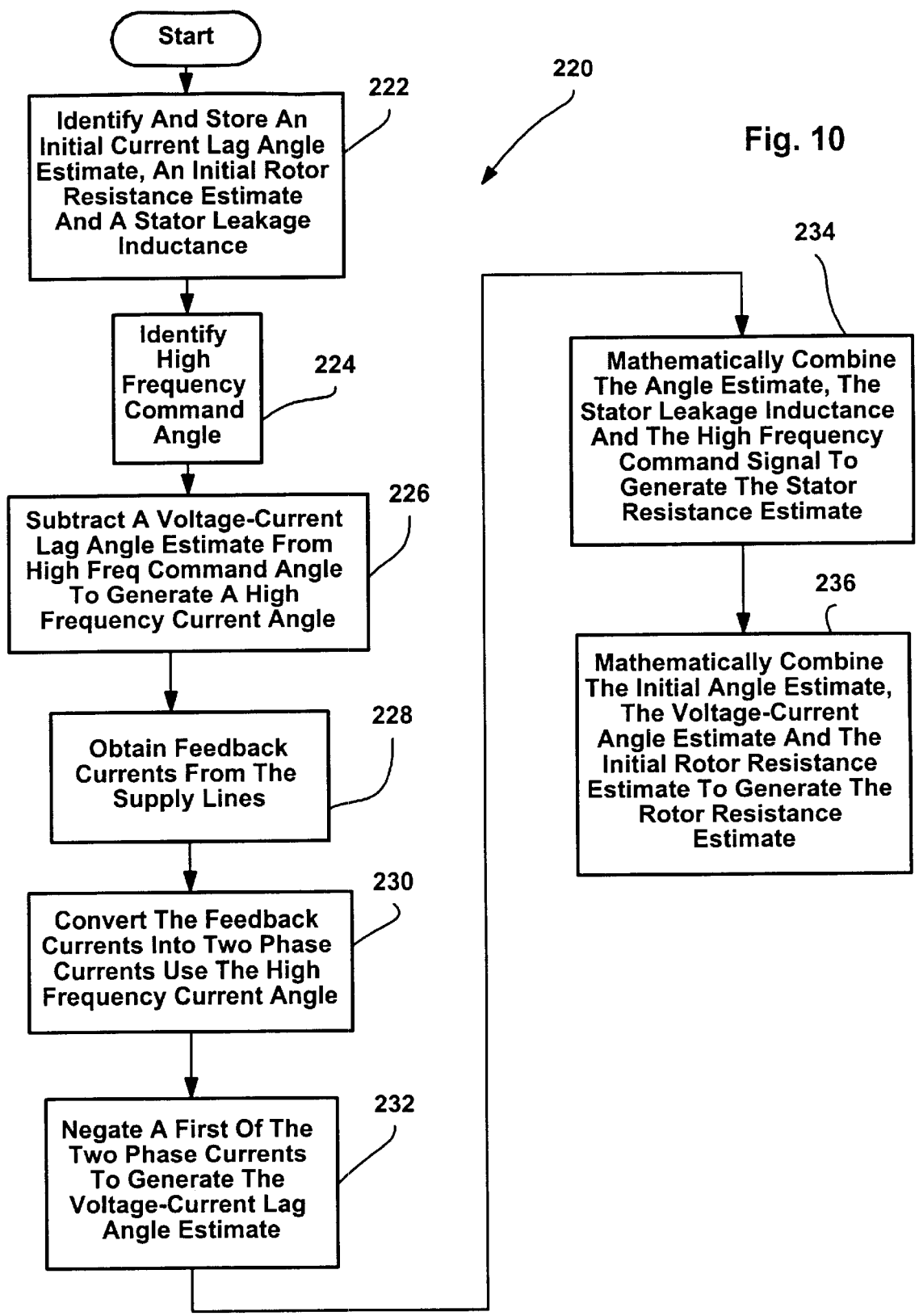
FIG. 10 is a flow chart illustrating one inventive method.

Referring now to FIGS. 2 and 4, stator-rotor resistance identifier 44 includes a plurality of multipliers 70, 72 and 84, two summers 92 and 96, a memory device 76, a cotangent module 74, a divider 82, a low pass filter 86, a 3-to-2 phase transformer 88, a low pass filter 90 and a current regulator 94. Referring also to FIG. 10, an exemplary flow chart illustrating one inventive method 220 performed by identifier 44 is illustrated. At block 222, several values are stored in memory 76 including a stator leakage inductance value $L_{\sigma s}$ an initial lag angle value $\phi_{do}$ and an initial rotor resistance value $R_{ro}$. Stator leakage inductance $L_{\sigma s}$ is typically a nameplate value but could be determined during a commissioning procedure if necessary. Similarly, initial rotor resistance value $R_{ro}$ may also be a nameplate value or could be determined and stored during a commissioning procedure. The initial lag angle $\phi_{do}$ is determine during a commissioning procedure and, where rotor resistance $R_{ro}$ is determined during commissioning, is preferable determined at the time when the initial rotor resistance value $R_{ro}$ is determined. Angle $\phi_{do}$ can be determined by, after allowing system 10 to operate for a few minutes, storing an estimate $\phi'_d$ as the initial value $\phi_{do}$.

The high frequency command angle $\theta_h$ is provided to summer 92. In addition, summer 92 receives the voltage-current lag angle estimate $\phi'_d$. At block 226 summer 92 subtracts angle estimate $\phi'_d$ from the high frequency command angle $\theta_h$ to generate a high frequency current angle estimate $\phi'_{hi}$ (see also FIG. 3). High frequency current angle estimate $\phi'_{hi}$ is provided to 3-2 phase transformer 88 and is used thereby to convert three phase currents to two orthogonal phase d and q access currents. To this end, at block 228 transformer 88 also receives the two three phase high frequency feedback currents $i_{vhf}$ and $i_{whf}$. The two high frequency feedback currents $i_{vhf}$ and $i_{whf}$ are used to determine the third high frequency feedback current $i_{uhf}$ and then the three phase feedback currents $i_{uhf}$, $i_{vhf}$ and $i_{whf}$ are converted to d and q axis high frequency currents $i_{dhi}$ and $i_{qhi}$, respectively at block 230.

Next, q-axis high frequency current $i_{qhi}$ is provided to filter 90 which reduces signal noise. Filter 90 provides output to summer 96 which subtracts (i.e., negates) the high frequency q-axis feedback current $i_{qhf}$ from zero and provides the output to PI regulator 94 at block 232. Regulator 94 steps up the received signal by PI regulator and provides the voltage-current lag angle estimate $\phi'_d$ as an output to summer 92.

Thus, the components consisting of summers 92 and 96, transformer 88, filter 90 and current PI regulator 94 cooperate to establishing a new two orthogonal phase coordinate system for the feedback currents wherein the new coordinate system d-axis coincides with the high frequency current $I_h$, drives the q-axis component to zero and uses the q-axis current error to generate the voltage-current lag angel estimate $\phi'_d$.

The voltage-current lag angle estimate $\phi'_d$ is then mathematically combined with the leakage inductance $L_{\sigma s}$ and the high frequency command signal $\omega_h$ to generate the instantaneous stator resistance estimate $R'_s$ at block 234. Continuing, at block 236 the initial voltage-current angle estimate $\phi_{d0}$ and initial rotor resistance estimate $R_{ro}$ are mathematically combined to generate the rotor resistance estimate $R'_r$.

More specifically, in one embodiment voltage-current lag angle estimate $\phi'_d$ is provided to low pass filter 86 which again reduces signal noise and provide an average value of this angle, the output of filter 86 being provided to each of cotangent module 74 and divider 82. Multipliers 70 and 72 and cotangent module 74 simply perform the calculation indicated by the Equation 1 above. Specifically, module 74 receives angle $\phi'_d$ and provides the cotangent of that angle to multiplier 72. Multiplier 70 receives the high frequency signal $\omega_h$ and multiplies that signal by the stator leakage inductance $L_{\sigma s}$ providing its output to multiplier 72. Multiplier 72 multiplies two received signals and generates stator resistance estimate $R'_s$ as indicated.

Divider 82 receives the initial voltage-current lag angle $\phi'_{d0}$ and divides angle $\phi'_{d0}$ by the instantaneous voltage-current lag angle estimate $\phi'_d$ to generate a stator resistance ratio which is provided to multiplier 84. Multiplier 84 multiplies the stator resistance ratio by the initial rotor resistance $R'_{ro}$ and generates rotor resistance value $R'_r$. In effect, components 82 and 84 simply solve Equation 2 above.

Referring again to FIG. 2, the stator and rotor resistance estimates $R'_s$ and $R'_r$, respectively, are provided to flux angle position and motor speed determiner 46. Determiner 46 uses the received signals (i.e., $R'_s$, $R'_r$, $I_{hzsf}$, $\theta_h$, etc.) to perform various algorithms to generate the electrical angle $\theta_e$ and a motor speed estimate (i.e., the signal provided on output line 54) in a manner well known in the art.

Figure 5:
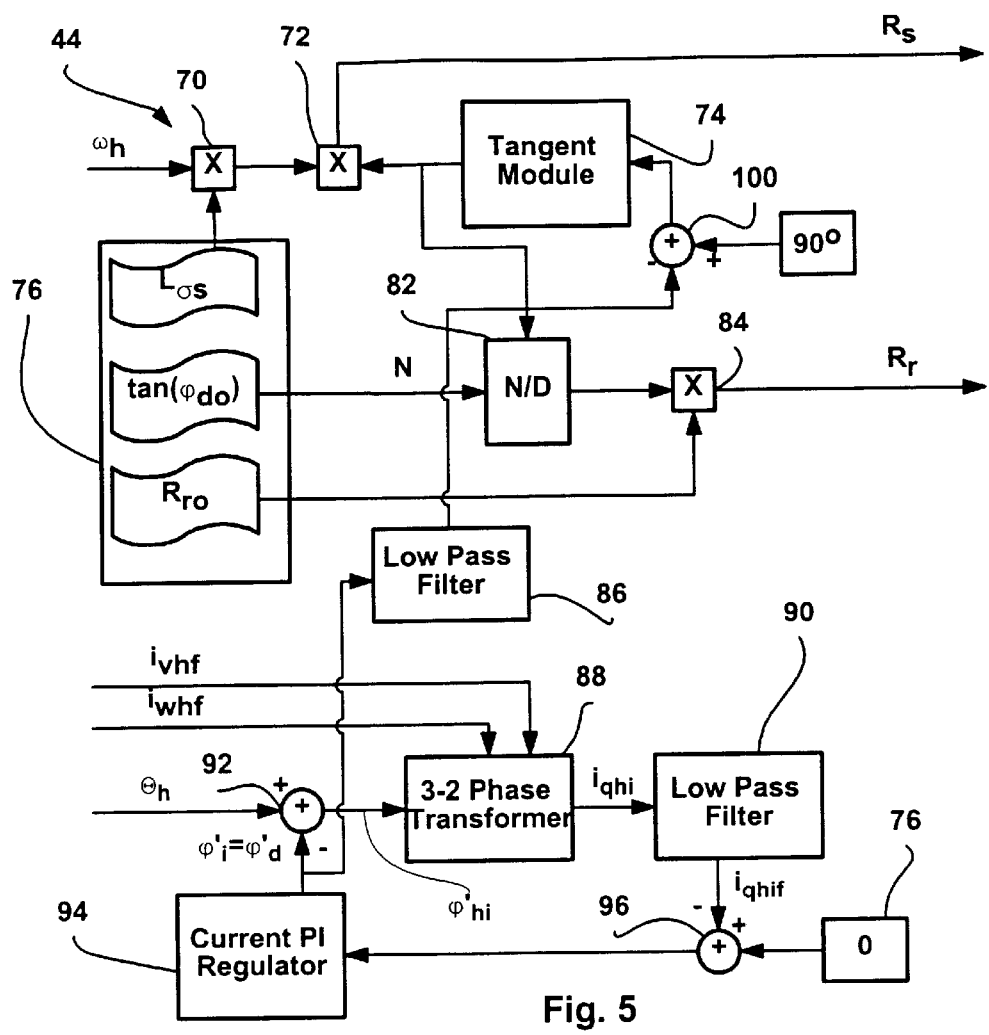
FIG. 5 is similar to FIG. 4, albeit of a second embodiment of the stator/rotor resistance identifier of FIG. 2.

Referring now to FIG. 5, a second embodiment of identifier 44 is illustrated. The embodiment illustrated in FIG. 5 carries out a method consistent with Equations 3 and 4 above. Many of the components in the embodiment of FIG. 5 are similar or identical to the components in the embodiment of FIG. 4 and therefore will not be described again in great detail. To this end, generally, components 86, 92, 88, 90, 96 and 94 operate in an identical fashion to the embodiment described with respect to FIG. 4 to generate an estimated voltage-current lag angle ($\phi'_d$. In addition, memory 76 is similar to the memory described above including storage of the stator leakage inductance value $L_{\sigma s}$ and the initial rotor resistance value $R_{ro}$. Memory 76 in FIG. 5 is different in that, instead of storing the initial angle value $\phi_{d0}$, memory 76 stores the tangent of the initial lag angle $\phi_{d0}$. Filter 86 provides its output to a summer 100 which subtracts the voltage-current lag angle estimate $\phi'_d$ from 90° and provides its output to tangent module 74. As its name implies, tangent module 74 determines the tangent of the received angle and provides the tangent value as an output to each of multiplier 72 and divider 82.

Multiplier 70 receives the high frequency command signal $\omega_h$ and retrieves the stator leakage inductance value $L_{\sigma s}$ and multiplies those two values providing its output to multiplier 72. Multiplier 72 multiplies the tangent value and the other received value and provides the stator resistance estimate $R'_s$ as an output.

In addition to receiving the tangent value form module 74, divider 82 obtains the tangent of the initial voltage-current lag angle $\phi'_{d0}$ and divides the tangent of the initial angle by the tangent value provided by module 74, providing its output to multiplier 84. Multiplier 84 retrieves the initial rotor resistance values $R_{ro}$ and multiplies that value by the stator resistance ratio to provide the rotor resistance estimate $R'_r$ as illustrate.

It should be understood that the methods and apparatuses described above are only exemplary and do not limit the scope of the invention, and that various modifications could be made by those skilled in the art that would fall under the scope of the invention. For example, referring again to FIG. 3, while the invention is described above as including a process wherein an angle estimate $\phi'_d$ is used to identify two phase vectors for a high frequency current in a coordinate system where the high frequency current is ideally aligned with the d-axis, it should be appreciated that another angle estimate $\phi'_q$ may be employed to cause the high current $I_h$ to coincide with a q-axis. In this case lag angle error would be indicated by the presence of any d-axis current. To this end, referring now to FIG. 6, a second shifted current reference frame includes axis $d_{hi}$ and $q_{hi}$ as illustrated where axis $q_{hi}$ coincides with high frequency current $I_h$.

Referring again to FIG. 4 and FIG. 6, in this embodiment, instead of generating q-axis current $i_{qhi}$, transformer 88 generates a d-axis current $i_{dhi}$ which is filtered at 90 and then negated at summer 96 prior to being stepped up by PI regulator 94 to provide a current lag angle estimate $\phi'_l$ that is equal to ninety degree minus voltage-current lag angle estimate $\phi'_d$ (i.e. $\phi'_l = \phi'_q = 90° - \phi'_d$). Estimate $\phi'_l = \phi'_q$ is then subtracted from the high frequency angle $\theta_h$ to generate angle estimate $\phi'_{hi}$, which is again used by transformer 88.

In addition, in this embodiment, estimate $\phi'_q$ is used in a fashion similar to that described above, to generate rotor and stator resistance estimates. To this end, based on the trigonometric relationships illustrated in FIG. 6, stator resistance estimate $R'_s$ may be generated by solving the following equation:

$$R'_s = \tan(\phi'_q)(\phi_h)(L_{\sigma s}) \qquad \text{Eq. 5}$$

Moreover, in this embodiment, instead of initially storing an angle $\phi'_{do}$, an initial angle $\phi'_{qo}$ is stored and rotor resistance $R'_r$ is then determined by solving the following equation:

$$R'_r = R_{ro}\left(\frac{\varphi'_{qo}}{\varphi'_q}\right) \qquad \text{Eq. 6}$$

Figure 6:
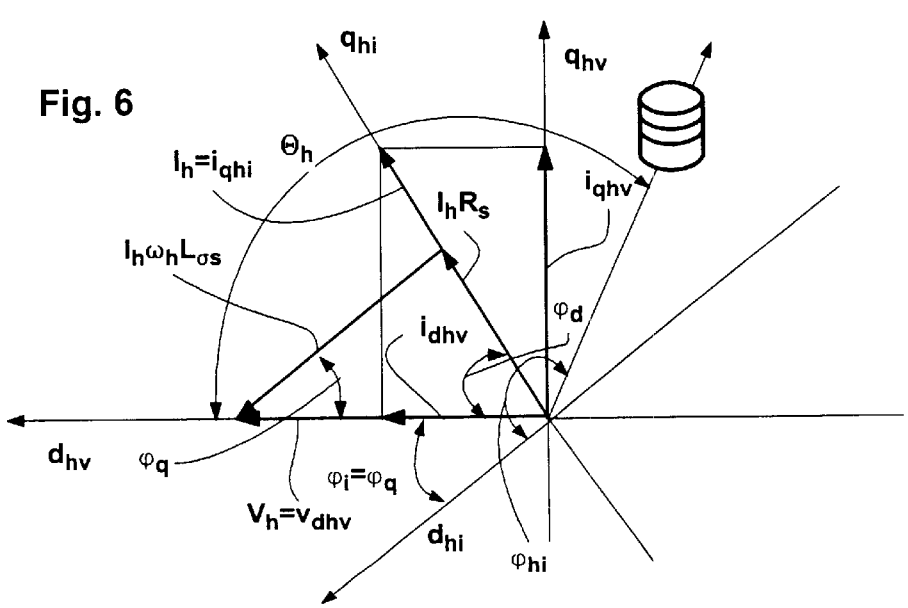
FIG. 6 is a similar to FIG. 3, albeit illustrating a different set of dq reference fames and corresponding electrical characteristics.

In the alternative, again based on the relationships of FIG. 6, resistance $R'_s$ may be determined by solving the following equation:

$$R'_s = ctg\left(\frac{\pi}{2} - \varphi'_q\right)(\omega_h)(L_{\sigma s}) \qquad \text{Eq. 7}$$

and rotor resistance $R'_r$ can then be determined according to the equation:

$$R'_r = R_{ro}\left(\frac{ctg\left(\frac{\pi}{2} - \varphi'_{q0}\right)}{ctg\left(\frac{\pi}{2} - \varphi'_q\right)}\right) \quad \text{Eq. 8}$$

As another example, while the invention is described above in the context of a method where only a d-axis high frequency injection voltage is employed, the invention is also applicable in cases where the high frequency voltage is injected between d and q axis. For instance, referring to FIG. 7, a voltage $V_h$ is injected between axis $d_{vh}$ and $q_{hv}$ and high frequency current $I_h$ results. In this case, a voltage-current lag angle estimate $\phi'_d$ can be determined by solving the following equation:

$$\phi'_d = abs\{abs(\phi_i) - abs(\phi_v)\} \quad \text{Eq. 9}$$

where angles $\phi_i$ and $\phi_v$ can be determined in a manner similar to that described above with respect to angle estimate $\phi'_d$.

To this end, referring again to FIG. 2, voltage sensors are linked to each of the motor supply lines and are fed to a voltage AD scalar 69, which converts the sensor signals to digital signals and amplifies the signals so that the signals are at amplitudes that are suitable for data processing. Module 69 also can generate a zero sequence voltage signal $V_z$, which is provided to filter 48. Filter 48 passes the high frequency zero sequence component $V_{hzsf}$ to determiner 46 which in turn uses the received signal in any of several different algorithms known in the art.

In addition to signal $V_z$, module 69 also generates digital v and w phase voltage signals that are provided to filter 50. Filter 50 passes only high frequency voltage components $V_{vhf}$ and $V_{whf}$ on to identifier 44. Referring also to FIG. 8, components which comprise an identifier 44 for use in the case of injection voltages between axis are illustrated and includes summers 192, 196, 193, 197 and 198, transformers 188 and 189, filters 190 and 191, registers (i.e., memory) 176 and 177 and regulators 194 and 195. Transformer 188 receives each of voltage feedback signals $V_{vhf}$ and $V_{whf}$ and a high frequency voltage angle $\phi'_{hv}$ and uses angle $\phi'_{hv}$ to convert the three phase voltages to d and q-axis voltages. Q-axis voltage $V_{qhv}$ is provided to filter 190 and then to summer 196 where signal $V_{qhv}$ is negated. Regulator 194 steps up the negated q-axis voltage $V_{qhv}$ to generate a voltage lag angle estimate $\phi'_v$. Summer 192 subtracts estimate $\phi'_v$ from high frequency angle $\theta_h$ thereby generating high frequency voltage angle estimate $\phi'_{hv}$. In this manner a new coordinate system is identified where high frequency voltage $V_h$ coincides with the d-axis of the coordinate system in a manner similar to that illustrated in FIG. 3 above. In FIG. 8 the new coordinate system is identified as $d_{hv}^* q_{hv}^*$.

Next, referring still to FIG. 8, components 193, 189, 191, 195, 197 and 177 operate in the same fashion as similar components described above with respect to FIG. 4 to receive feedback currents $i_{vhf}$ and $i_{whf}$ and angle $\theta_h$ and generate current lag angle estimate $\phi'_i$ (similar to $\phi'_i = \phi'_d$ as described above with respect to FIG. 4) and therefore are not explained again here in detail.

Angle estimates $\phi'_v$ and $\phi'_i$ are provided to summer 198 where lag angle $\phi'_v$ is subtracted from a value of lag angle $\phi'_i$ according to the Equation 9 and a result becomes an absolute value of a voltage-current lag angle estimate $\phi'_d$. As illustrated and, also referring to FIGS. 4 and 5, estimate $\phi'_d$ is provided to filter 86 in either of FIG. 4 or 5 to determine resistances $R_s$ and $R_r$ as described above.

Figure 9:
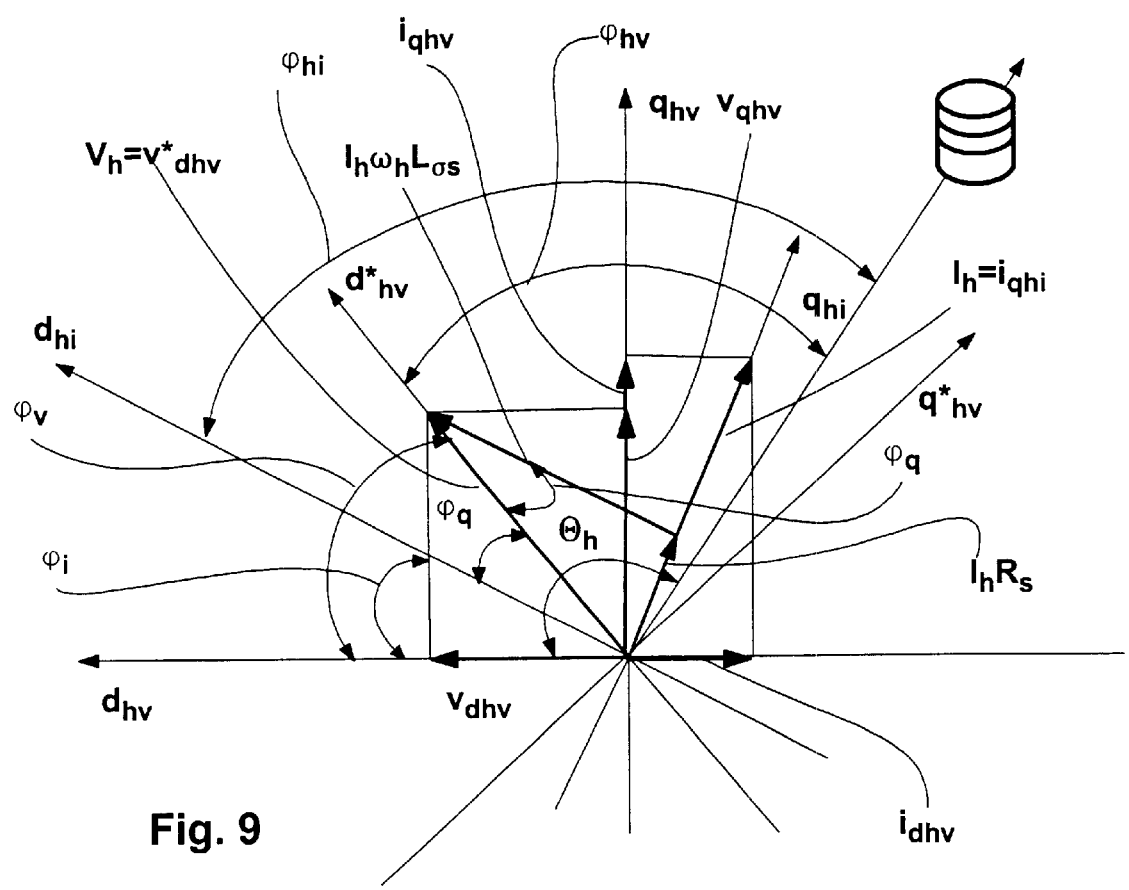
FIG. 9 is similar to FIG. 7.

Although not illustrated above, it should further be appreciated that when high frequency signals are injected between d and q-axis, instead of identifying a coordinate system where current $I_h$ is coincident with the d-axis, a new coordinate system may be identified where current $I_h$ is coincident with the q-axis. As in the description above corresponding to FIG. 9, in this case a lag angle estimate $\phi'_q$ can be determined by solving the following equation:

$$\phi'_q = abs\{abs(\phi_i) - abs(\phi_v)\} \quad \text{Eq. 10}$$

where angles $\phi_i$ and $\phi_v$ can be determined in a manner similar to that described above with respect to angle estimate $\phi'_q$. Equations 5 and 6 or 7 and 8 would be used to determine resistance values $R'_r$ and $R'_s$.

It should also be noted that while various feedback loops are illustrated in the Figures described above, most of the embodiments of the invention do not require all of the feedback loops and the loops are only shown as illustrative. For instance, some of the embodiments do not require voltage feedback signals.

To apprise the public of the scope of this invention, the following claims are made:

What is claimed is:

1. A method for estimating a motor stator resistance in a three phase motor characterized by a stator leakage inductance and driven by a pulse width modulator that is linked to the motor via three supply lines, the method for use with a system that receives a high frequency voltage command signal and causes high frequency voltages to be injected into each of the three motor phases at the high frequency, the method comprising the steps of:

identifying a high frequency command angle;

subtracting a current lag angle estimate from the high frequency command angle to generate a high frequency current angle;

obtaining feedback of high frequency current components from the supply lines;

converting the feedback of high frequency current components into two phase currents using the high frequency current angle;

negating a first of the two phase currents to generate a current lag angle estimate; and using the current lag angle estimate as a voltage-current lag angle estimate to generate the stator resistance estimate.

2. The method of claim 1 wherein the two phase currents are a flux producing current and a torque producing current and wherein the step of negating the first of the two phase currents includes the step of negating the torque producing current component.

3. The method of claim 1 wherein the step of using the current lag angle estimate as a voltage-current lag angle estimate to generate the stator resistance estimate includes the step of mathematically combining the voltage-current lag angle estimate, the stator leakage inductance and the high frequency command angle to generate the stator resistance estimate.

4. The method of claim 3 wherein the motor is also characterized by a stator leakage reactance and wherein step of mathematically combining includes the step of determining the cotangent of the voltage-current lag angle estimate to generate a cotangent value and multiplying the high frequency command signal in radians per second, the cotangent value and the stator leakage reactance to generate the stator resistance estimate.

5. The method of claim 4 also for generating a rotor resistance estimate and including the step of using the current lag angle estimate as a voltage-current lag angle estimate to generate the rotor resistance estimate.

6. The method of claim 5 wherein the step of using the current lag angle estimate as a voltage-current lag angle estimate to generate the rotor resistance estimate includes the steps of identifying and storing an initial voltage-current lag angle estimate, identifying an initial rotor resistance estimate, dividing the initial voltage-current lag angle estimate by the voltage-current lag angle estimate to generate a stator resistance ratio and multiplying the initial rotor resistance estimate by the stator resistance ratio to generate the rotor resistance estimate.

7. The method of claim 3 wherein the step of mathematically combining includes the step of determining the tangent of ninety degrees less the voltage-current lag angle estimate to generate a tangent value, converting the high frequency command signal into a radians per second value and multiplying the radians per second value, the tangent value and the stator leakage reactance to generate the stator resistance estimate.

8. The method of claim 7 also for generating a rotor resistance estimate and including the step of using the tangent value to generate the rotor resistance estimate.

9. The method of claim 8 wherein the step of using the tangent value to generate the rotor resistance estimate includes the steps of identifying an initial voltage-current lag angle estimate and storing the tangent of the initial voltage-current lag angle estimate, identifying an initial rotor resistance estimate, dividing the tangent of the initial estimate by the tangent value to generate a stator resistance ratio and multiplying the initial rotor resistance estimate by the stator resistance ratio to generate the rotor resistance estimate.

10. The method of claim 1 further including the steps of, prior to using the current lag angle estimate as a voltage-current lag angle estimate, stepping up the current lag angle estimate to generate a stepped up angle estimate and setting the lag angle estimate equal to the stepped up angle estimate.

11. The method of claim 1 wherein the step of identifying a high frequency command angle includes the step of converting the high frequency command signal into the high frequency command angle.

12. The method of claim 1 wherein the high frequency voltage is injected between orthogonal d and q axis, the method further comprises the steps of:

subtracting a voltage lag angle estimate from the high frequency command angle to generate a high frequency voltage angle;

obtaining feedback voltages from the supply lines;

converting the feedback voltages into two phase voltages using the high frequency voltage angle; and negating a first of the two phase voltages to generate a voltage lag angle estimate; and wherein the step of using the current lag angle estimate as a voltage-current lag angle estimate includes the steps of identifying the absolute value of the difference between an absolute value of the voltage lag angle estimate and an absolute value of the current lag angle estimate as the voltage-current lag angle estimate and using the voltage-current lag angle estimate to generate the stator resistance estimate.

13. An apparatus for estimating a motor stator resistance in a three phase motor characterized by a stator leakage inductance and driven by a pulse width modulator that is linked to the motor via three supply lines, the apparatus for use with a system that receives a high frequency voltage command signal and causes high frequency voltages to be injected into each of the three motor phases at the high frequency, the apparatus comprising:

an identifier for identifying a high frequency command angle;

a first summer for subtracting an current lag angle estimate from the high frequency command angle to generate a high frequency current angle;

a sensor for obtaining feedback currents from the supply lines;

a converter for converting the feedback currents into two phase currents;

a second summer for negating a first of the two phase currents to generate a current lag angle estimate; and a determiner for using the current lag angle estimate as a voltage-current lag angle estimate to generate the stator resistance estimate.

14. The apparatus of claim 13 wherein determiner includes a cotangent module for determining the cotangent of the voltage-current lag angle estimate thereby generating a cotangent value, and a multiplier for multiplying the high frequency command signal in radians per second value, the cotangent value and the stator leakage reactance to generate the stator resistance estimate.

15. The apparatus of claim 14 also for generating a rotor resistance estimate herein an initial voltage-current lag angle estimate and an initial rotor resistance estimate are provided, the apparatus further including a divider for dividing the initial voltage-current lag angle estimate by the voltage-current lag angle estimate to generate a stator resistance ratio and a second multiplier for multiplying the initial rotor resistance estimate by the stator resistance ratio to generate the rotor resistance estimate.

16. The apparatus of claim 13 wherein the determiner includes a tangent module for determining the tangent of ninety degrees less the voltage-current lag angle estimate to generate a tangent value, and a multiplier for multiplying the high frequency command signal in radians per second value, the tangent value and the stator leakage reactance to generate the stator resistance estimate.

17. The apparatus of claim 16 also for generating a rotor resistance estimate wherein an initial voltage-current lag angle estimate and an initial rotor resistance estimate are provided, the apparatus further including a divider for dividing the tangent of the initial estimate by the tangent value to generate a stator resistance ratio and a second multiplier for multiplying the initial rotor resistance estimate by the stator resistance ratio to generate the rotor resistance estimate.

18. The apparatus of claim 13 wherein the identifier includes an integrator that integrates the high frequency command signal.

19. The apparatus of claim 13 wherein the high frequency voltage is injected between d and q axis and wherein the identifier includes:

an integrator for converting the high frequency signal into a high frequency command angle;

a summer for subtracting a voltage lag angle estimate from the high frequency command angle to generate a high frequency voltage angle;

sensors for obtaining feedback voltages from the supply lines;

a transformer for converting the feedback voltages into two phase voltages using the high frequency voltage angle;

a summer for negating a first of the two phase voltages to generate a voltage lag angle estimate; and a summer for generating the absolute value of the difference between an absolute value of the voltage lag angle estimate and an absolute value of the current lag angle estimate as a voltage-current lag angle estimate.

20. The apparatus of claim 13 further including a PI controller for stepping up the negated first of the two phase currents to generate the current lag angle estimate.

21. An apparatus for estimating a motor stator resistance in a three phase motor characterized by a stator leakage inductance and driven by a pulse width modulator that is linked to the motor via three supply lines, the apparatus for use with a system that receives a high frequency voltage command signal and causes high frequency voltages to be injected into each of the three motor phases at the high frequency, the apparatus comprising:

means for converting the high frequency command signal into a high frequency command angle;

means for subtracting a voltage-current lag angle estimate from the high frequency command angle to generate a high frequency current angle;

means for obtaining feedback currents from the supply lines;

means for converting the feedback currents into two phase currents;

means for negating a first of the two phase currents to generate a voltage-current lag angle estimate; and means for using the voltage-current lag angle estimate to generate the stator resistance estimate.

22. The apparatus of claim 21 wherein the means for using the voltage-current lag angle estimate to generate the stator resistance estimate includes a means for determining the cotangent of the voltage-current lag angle estimate thereby generating a cotangent value, and a means for multiplying the high frequency command signal in radians per second value, the cotangent value and the stator leakage reactance to generate the stator resistance estimate.

23. The apparatus of claim 22 also for generating a rotor resistance estimate wherein an initial voltage-current lag angle estimate and an initial rotor resistance estimate are provided, the apparatus further including a means for dividing the initial voltage-current lag angle estimate by the voltage-current lag angle estimate to generate a stator resistance ratio and a means for multiplying the initial rotor resistance estimate by the stator resistance ratio to generate the rotor resistance estimate.

24. The apparatus of claim 21 wherein the means for using the voltage-current lag angle estimate to generate the stator resistance estimate includes a means for determining the tangent of ninety degrees less the voltage-current lag angle estimate to generate a tangent value, and a means for multiplying the high frequency command signal in radians per second value, the tangent value and the stator leakage reactance to generate the stator resistance estimate.

25. The apparatus of claim 24 also for generating a rotor resistance estimate wherein an initial voltage-current lag angle estimate and an initial rotor resistance estimate are provided, the apparatus further including a means for dividing the tangent of the initial voltage-current lag angle estimate by the tangent value to generate a stator resistance ratio and a means for multiplying the initial rotor resistance estimate by the stator resistance ratio to generate the rotor resistance estimate.

26. The apparatus of claim 21 further including means for stepping up the negated first of the two phase currents to generate the voltage-current lag angle estimate.

27. A method for estimating both a motor stator resistance and a rotor resistance in a three phase motor characterized by a stator leakage inductance and driven by a pulse width modulator that is linked to the motor via three supply lines, the method for use with a system that receives a high frequency voltage command signal and causes high frequency voltages to be injected into each of the three motor phases at the high frequency, the method comprising the steps of:

identifying and storing an initial voltage-current lag angle estimate;

identifying an initial rotor resistance estimate;

converting the high frequency command signal into a high frequency command angle;

subtracting a current lag angle estimate from the high frequency command angle to generate a high frequency current angle;

obtaining feedback currents from the supply lines;

converting the feedback currents into two phase currents including a torque producing current and a flux producing current;

negating the torque producing current;

stepping up the negated torque producing current to generate the current lag angle estimate and using the current lag angle estimate as a voltage-current lag angle estimate;

determining the cotangent of the voltage-current lag angle estimate to generate a cotangent value;

multiplying the high frequency command signal in radian per second value, the cotangent value and the stator leakage reactance to generate the stator resistance estimate;

dividing the initial voltage-current lag angle estimate by the voltage-current lag angle estimate to generate a stator resistance ratio; and multiplying the initial rotor resistance estimate by the stator resistance ratio to generate the rotor resistance estimate.

28. A method for estimating both a motor stator resistance and a rotor resistance in a three phase motor characterized by a stator leakage inductance and driven by a pulse width modulator that is linked to the motor via three supply lines, the method for use with a system that receives a high frequency voltage command signal and causes high frequency voltages to be injected into each of the three motor phases at the high frequency, the method comprising the steps of:

identifying an initial voltage-current lag angle estimate;

identifying an initial rotor resistance estimate;

determining the tangent of the initial voltage-current lag angle estimate and storing the initial tangent value;

converting the high frequency command signal into a high frequency command angle;

subtracting a current lag angle estimate from the high frequency command angle to generate a high frequency current angle;

obtaining feedback currents from the supply lines;

converting the feedback currents into two phase currents including a torque producing current and a flux producing current;

negating the torque producing current;

stepping up the negated torque producing current to generate the current lag angle estimate;

determining the tangent of ninety degrees less the voltage-current lag angle estimate to generate a tangent value;

multiplying the high frequency command signal in radians per second value, the tangent value and the stator leakage reactance to generate the stator resistance estimate;

dividing the initial tangent value by the tangent value to generate a stator resistance ratio; and multiplying the initial rotor resistance estimate by the stator resistance ratio to generate the rotor resistance estimate.

* * * * *

UNITED STATES PATENT AND TRADEMARK OFFICE
CERTIFICATE OF CORRECTION

PATENT NO. : 6,636,012 B2
DATED : October 21, 2003
INVENTOR(S) : Royak et al.

It is certified that error appears in the above-identified patent and that said Letters Patent is hereby corrected as shown below:

Column 12,
Line 48, Eq. 5, "$\phi_h$" should be -- $\omega_h$ --.

Column 16,
Line 28, "herein" should be -- wherein --.

Signed and Sealed this

Third Day of May, 2005

JON W. DUDAS
*Director of the United States Patent and Trademark Office*